(12) United States Patent
Huang

(10) Patent No.: US 6,256,251 B1
(45) Date of Patent: Jul. 3, 2001

(54) CIRCUIT WITH VARIABLE VOLTAGE BOOSTING RATIOS IN A MEMORY DEVICE

(75) Inventor: Pei-Jey Huang, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 0 days.

(21) Appl. No.: 09/638,022

(22) Filed: Aug. 14, 2000

(51) Int. Cl.[7] .................................................. G11C 7/00
(52) U.S. Cl. ..................................... 365/226; 365/189.11
(58) Field of Search .............................. 365/226, 189.11; 327/536

(56) References Cited

U.S. PATENT DOCUMENTS 5,936,459 * 8/1999 Hamamoto ........................... 327/536

* cited by examiner

*Primary Examiner*—Huan Hoang
(74) *Attorney, Agent, or Firm*—Sughrue, Mion, Zinn, Macpeak & Seas, PLLC

(57) ABSTRACT

A circuit with variable voltage boosting ratios in a memory device for raising a booster line includes the first and second capacitors, and first and second switching means. The first capacitor electrically connects to the booster line for raising the voltage level on the booster line. The second capacitor couples to the booster line through the first switching means and the power line through the second switching means, respectively. When the first switching means is turned on and the second switching means is turned off, the second capacitor boosts the booster line together with the first capacitor. When the first switching means is turned off and the second switching means is turned on, the second switching means is precharged by the power line instead of boosting the booster line.

13 Claims, 5 Drawing Sheets

CIRCUIT WITH VARIABLE VOLTAGE BOOSTING RATIOS IN A MEMORY DEVICE

FIELD OF THE INVENTION

This invention relates to a circuit for boosting the voltage level on word-lines of DRAM devices. Specifically, the circuit is able to boost the voltage level on the word-line with variable voltage boosting ratios for responsive to different demands of voltage level on the word-line.

BACKGROUND OF THE INVENTION

When external power supply in the memory device, such as the DRAM, goes down, a serious problem encountered is the loss of cell signal due to noise in the circuit. The problem may not seriously hazard the performance of the memory device, when the external power supply is much higher than the threshold voltage of the transistors of the memory cell. For example, the external power supply reducing from 12 V to 10 V may not be a problem and still be enough to turn on the transistors of the memory cells through the word-lines. However, when the voltage level of the external power supply is quite close to the threshold voltage of the transistors, the reduction of the external power supply, for instance from 5 V to 3.5 V may cause the memory devices malfunctioned and therefore need to be resolved.

Traditionally, a boost circuit is embedded in the memory device for responsive to control signals to raise the voltage level on the word-lines for compensating the loss of cell signal. An example of the boost circuit was given by Betty Prince [1] as shown in FIG. 1. Preceding operation, node $N_1$ is charged to Vcc by clock R and a full charge is stored in capacitor C. Signal IN simultaneously triggers buffers A and B so as to push node $N_1$ to twice Vcc. Because node B and node $N_1$ are in the same voltage level, through node B, a boosted signal is provided and the problem of signal loss is overcome.

[1] Betty Prince "SEMICONDUCTOR MEMORIES—2nd edition" pp. 235–237.

Another traditional boost circuit includes a number of individual booster active kickers connected to a booster voltage power line, which branches to a group of world-lines down stream, in parallel for generating enough charges to serve the word-lines. An example is shown in FIG. 2 by Kim et al. [2], The standby booster voltage generator 23 and a number of booster active kickers 15, 17, 19, . . . 21 are connected to the booster voltage power line 13 for responsive to the control signal PR to supply a boosted signal. One advantage of the boost circuit is the high capacitance for boosting. However, in some cases, there may be the shortcoming that pushing the voltage on the word-lines to an unacceptable high level so that resulting in unnecessary power consumption and undesired reliability issues.

[2] Kim et al. U.S. Pat. No. 5,867,442.

Kim et al. [2] proposed another boost circuit with many control signals, which are able to independently trigger the booster active kickers, for providing variable boost ratios in accommodation to various operation states, e.g. clock frequencies, external power supply voltages, etc.. As shown in FIG. 3. The standby booster voltage generator 23 and a number of booster active kickers 15, 17, 19, . . . 21 are connected to the booster voltage power line 13. Control signal PR, booster voltage active control signal PAK, and refresh cycle control signal REF together control the booster active kickers so as to provide variable boosting ratios for the booster voltage power line 13.

[2] Kim et al. U.S. Pat. No. 5,867,442.

Although the traditional techniques have merits on control flexibility due to the variable boost ratios, there is a room awaited for further improvement. For example, the booster active kickers are charged by the booster voltage power line when they are at both precharging and boosting mode. That is to say, whatever activated or not, the booster active kickers burden the booster voltage power line, thereby destabilizing the power supply through the booster voltage power line. Moreover, the designs of the traditional techniques are somewhat complicated to be implemented in memory devices. Given the shortcomings of the conventional arts, there establishes a huge need to improve the design of the boost circuit.

SUMMARY OF THE INVENTION

An objective of this invention is to provide a circuit with variable boosting ratios for raising the voltage level on the booster line in the memory device.

A circuit with variable voltage boosting ratios in a memory device for raising a booster line includes the first and second capacitors, and first and second switching means. The first capacitor electrically connects to the booster line, which branches to many word-lines in the memory device, for raising the voltage level on the booster line. The second capacitor couples to the booster line through the first switching means and the power line through the second switching means, respectively. When the first switching means is turned on and the second switching means is turned off, the second capacitor boosts the booster line together with the first capacitor. Therefore, a higher boosting ratio is contributed to raise the voltage on the booster line as well as the word-lines. When the first switching means is turned off and the second switching means is turned on, the second capacitor is precharged by the power line instead of boosting the booster line, thereby shortening the total precharging time of the circuit and improve the performance for the whole memory device.

BRIEF DESCRIPTION OF THE DRAWINGS

The above features of the present invention will be more clearly understood from consideration of the following descriptions in connection with accompanying drawings in which.

DETAILED DESCRIPTION OF THE PREFERRED EMBODIMENT

The spirit and application of the invention will be illustrated in detail by a following preferred embodiment. In the embodiment, a circuit for boosting the word-line will be initially described, and a timing chart representing the relation among many signals in the circuit will be subsequently discussed. Finally, a flow chart will be introduced for clarifying the operation scheme of the circuit. However, it is appreciated that the preferred embodiment is merely illustrative of specific ways to make and use this invention, and should not limit the scope of this invention.

Figure 1:
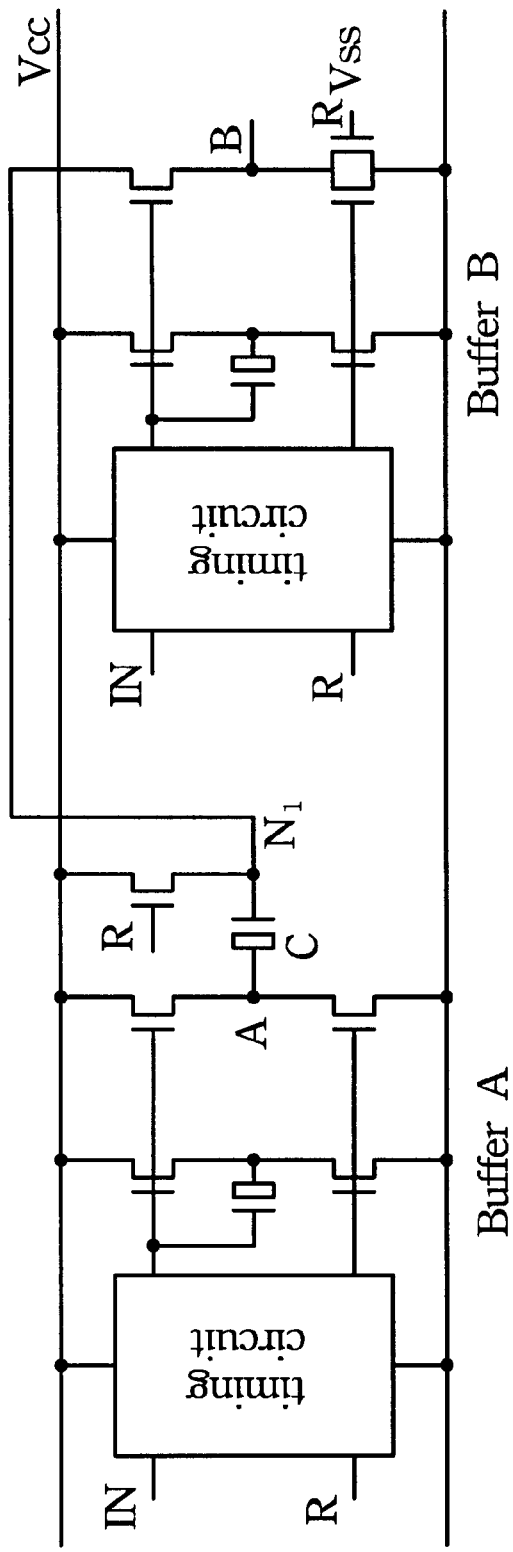
FIG. 1 illustrates boosted high-level clock generator in the prior art.
Figure 2:
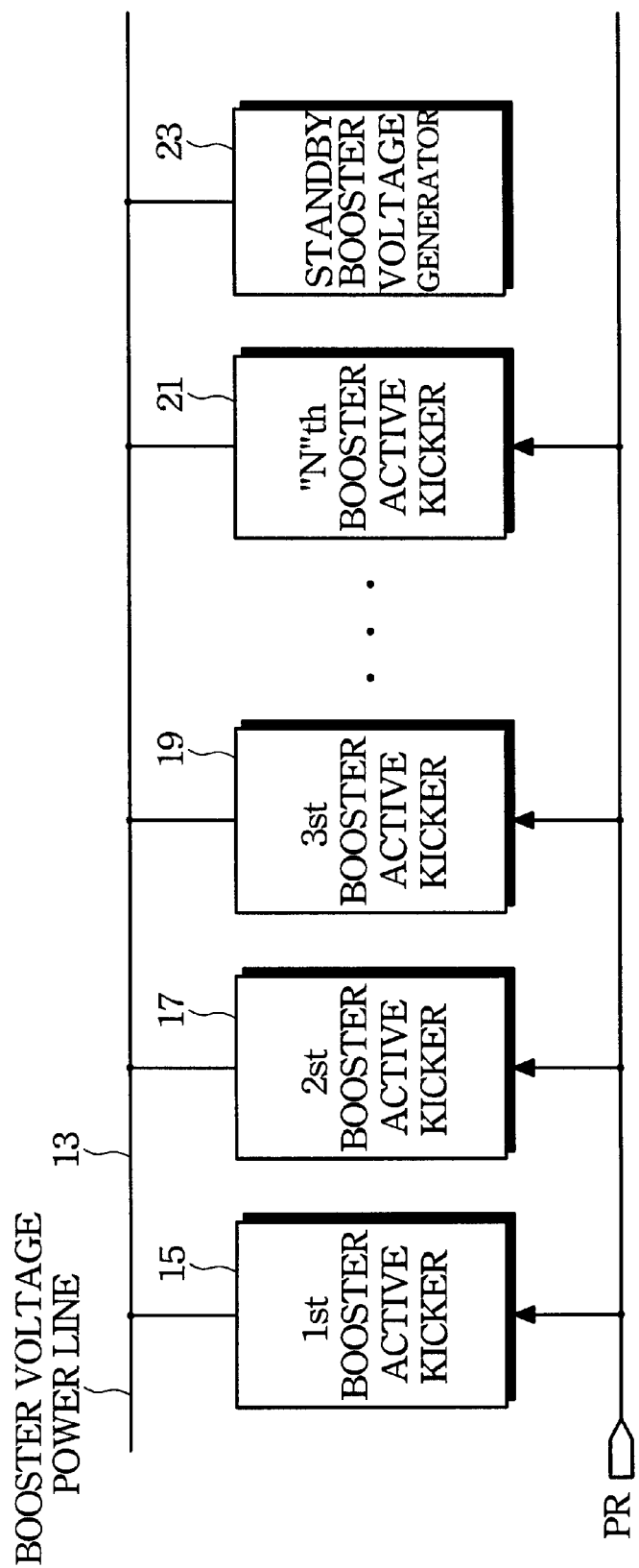
FIG. 2 is a block diagram of a boost circuit in the prior art.
Figure 3:
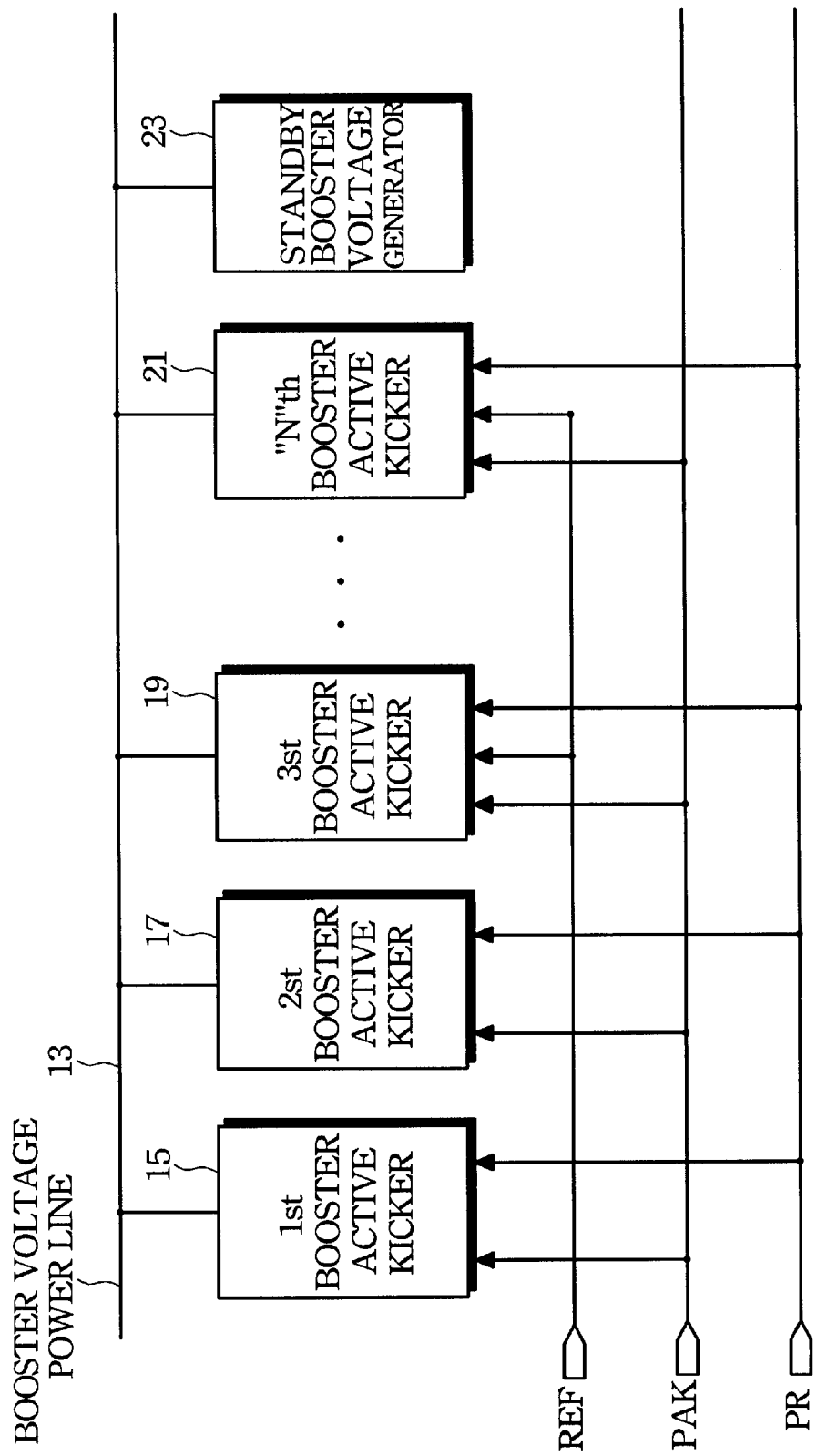
FIG. 3 is a block diagram of another boost circuit with variable boosting ratios in the prior art.
Figure 4:
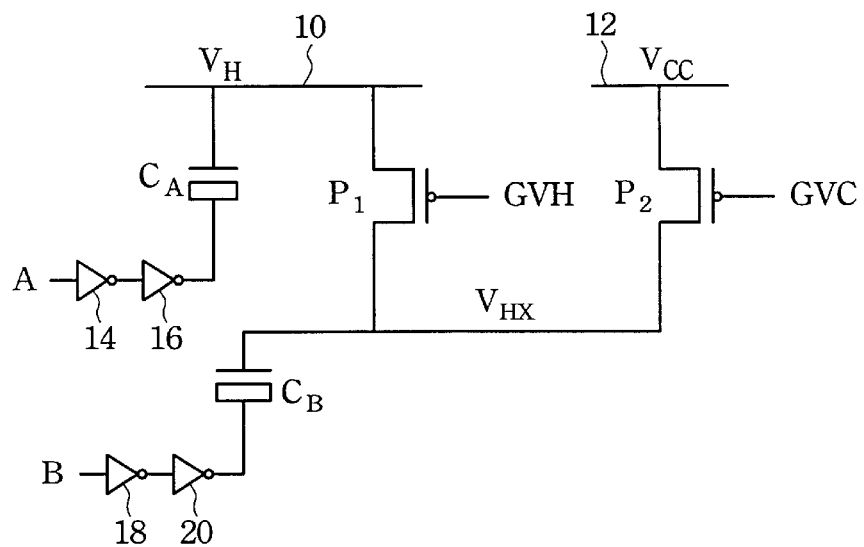
FIG. 4 illustrates a boost circuit of a preferred embodiment in this invention.

FIG. 4 shows a circuit embedded in a memory device, such as a DRAM, with variable voltage boosting ratios for raising the voltage level on the word-line of the memory device. Initially, the external power line 12 is biased to Vcc and the booster line 10, which branches to the word-lines down stream in the memory device, is biased to Vcc. The first capacitor $C_A$ is connected to the booster line 10, and the second capacitor $C_B$ is electrically connected to the booster line 10 and the external line 12 through the first switching means $P_1$ and the second switching means $P_2$, respectively. In this embodiment, the PMOS transistor is preferred as the candidate of the first and second switching means, but other devices, such as the NMOS transistor, bipolar transistor, and photo-coupled transistor, could also be used for the equivalent substitution.

Control signal A passing through and delayed by the inverters 14, 16 controls the first capacitor $C_A$ to boost the booster line 10 or be precharged by a precharging line (not shown in this figure). Likewise, through the inverters 18, 20, control signal B together with the first switching means $P_1$ and the second switching means $P_2$ controls the second capacitor $C_B$ to boost the booster line 10 or be precharged by the external power line 12. Because the first and second capacitors $C_A$, $C_B$ are independently controlled to raise the voltage level on the booster line 10, the boosting ratio of the circuit for the booster line 10 varies by operation states. That is to say, the first and second capacitors $C_A$, $C_B$ can concurrently boost the booster line 10 while the voltage level of the external power supply is relatively low, and the first capacitor can solely boost the booster line 10 while the voltage level of the external power supply is relatively high.

An example of how the circuit functions when the voltage level of the external power supply is high, e.g. 3.3 V (Vcc), is given as follows. In this case, control signal A goes high for kicking the first capacitor $C_A$ to raise the voltage level on the booster line 10. Meanwhile, the first switching means $P_1$ remained off, the second switching means $P_2$ remained on, and control signal B keeps low, so that the second capacitor $C_B$ won't burden the booster line 10. It is noticed that, when the second capacitor is absent from boosting, it consumes no power from the booster lines 10 and serves as a de-coupling capacitor for stabilizing the electric signals on the external power line 12.

Figure 5:
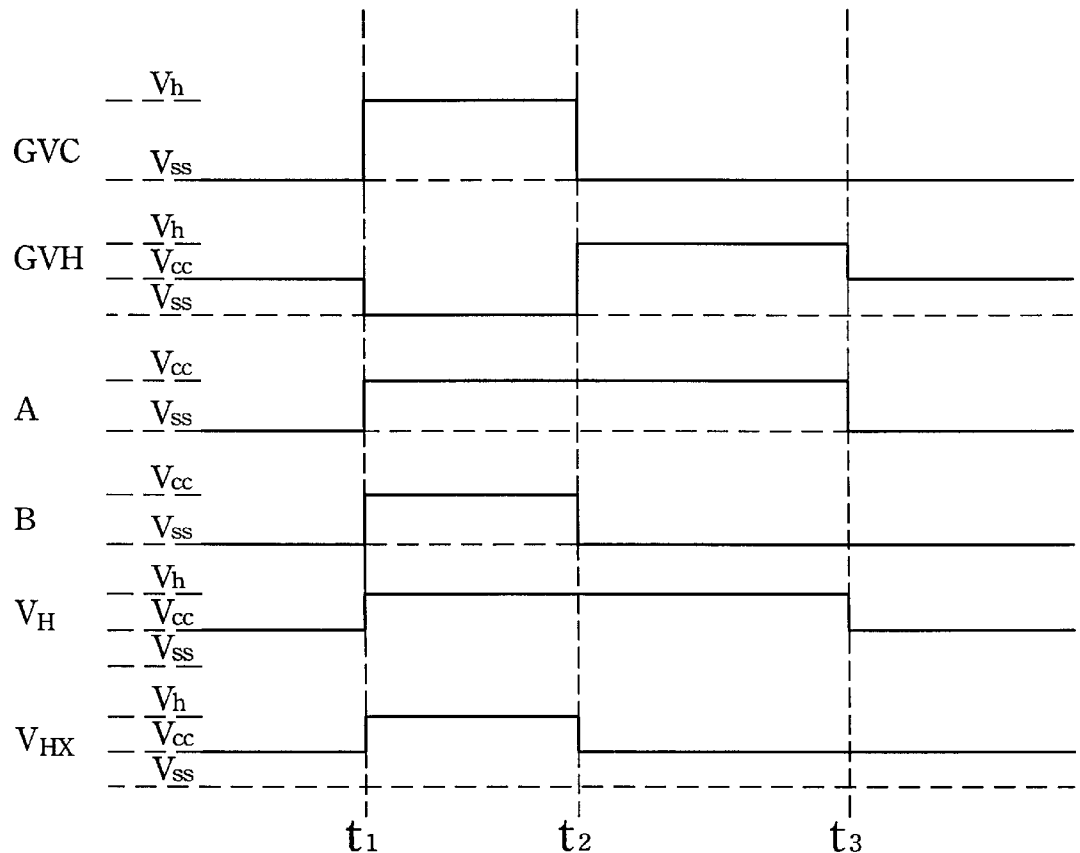
FIG. 5 is a timing chart of the preferred boost circuit in this invention.

Another example when the voltage level of the external power supply is low, e.g. 2.5 V (Vcc), is described as follows in accompany with FIGS. 4 and 5. In a completed operation cycle of the circuit, at time slice $t_1$, signal GVC raises to Vh to turn off the second switching means $P_2$, and signal GVH descends to Vss to turn on the first switching means $P_1$. At this moment, control signals A and B raise to Vcc to kick the first and second capacitors $C_A$, $C_B$ to boost the voltage level on the booster line 10. As a result, $V_H$ and $V_{HX}$ would be pushed from Vcc to Vh under a full boosting ratio. Shifting to time slice $t_2$, the moment that the memory device finishes the bit-line sensing process, signal GVC descends to Vss to turn on the second switching means $P_2$, and signal GVH raises to Vh to turn off the first switching means $P_1$. At this moment, control signal A remains at Vcc and control signal B drops to Vss, thereby leaving solely the first capacitor $C_A$ to boost the booster line 10. Since the voltage level on the booster line 10 has maintained stable at this moment, only the first capacitor $C_A$ is capable to maintain $V_H$ at Vh level. And at $t_2$, the second capacitor $C_B$ can be precharged to Vcc by the external power line 12 and serves as the de-coupling capacitor for stabilizing the external power supply Vcc. Finally at time slice $t_3$, control signals A, B and GVC staying at Vss and staying at Vcc, the first and second capacitors $C_A$ and $C_B$ are precharged by a precharging line (not shown in the figures) and the external power line 12, respectively, for preparing the next cycle of boosting.

Figure 6:
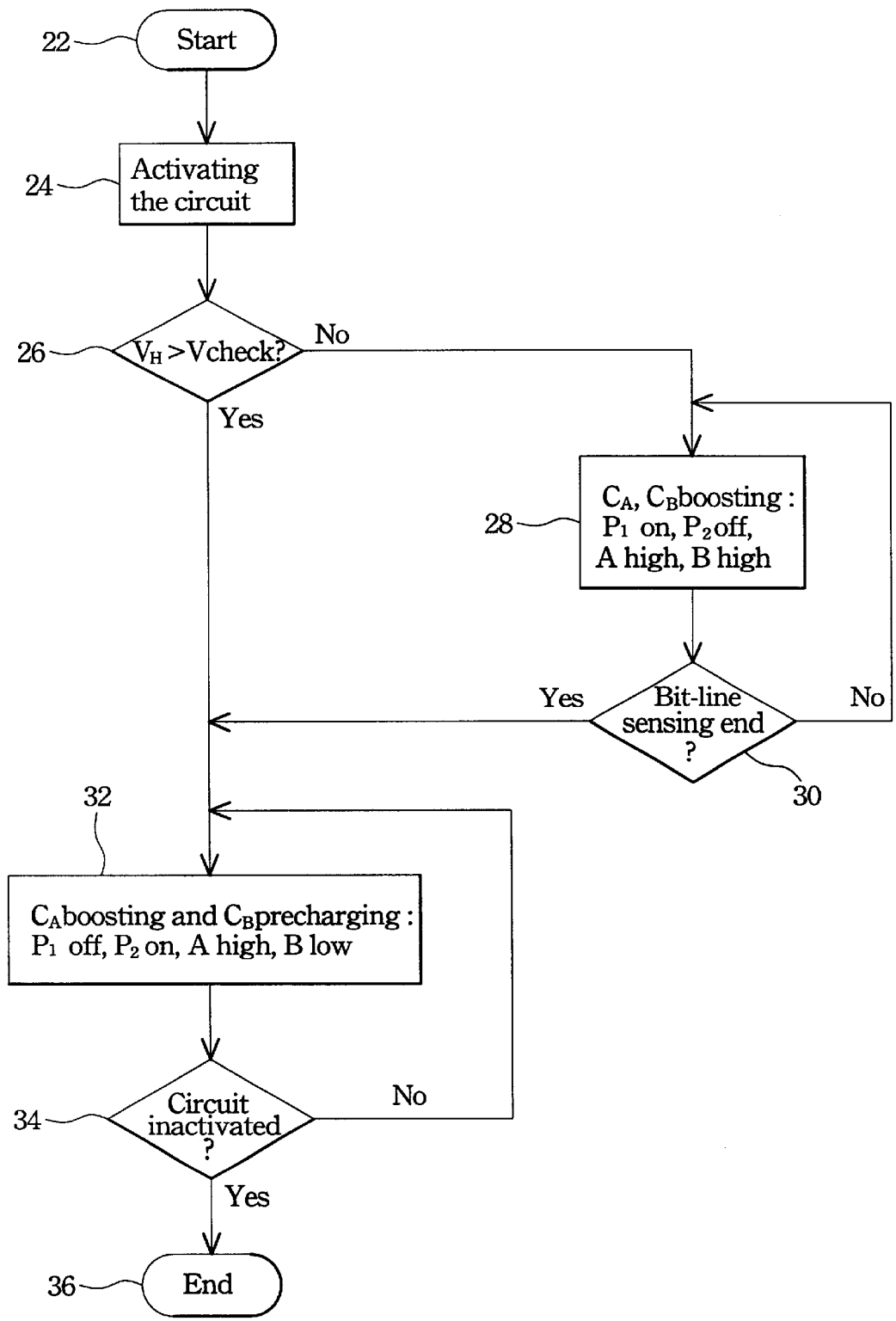
FIG. 6 is a flow chart showing the operation scheme of the preferred boost circuit in this invention.

The operation scheme of the present circuit is detailed in FIG. 6. For each operation cycle, the scheme starts at step 22, and then the circuit is activated to boost the booster line at step 24. Step 26 checks whether the voltage level on the booster line is greater than a predetermined check value $V_{check}$, if it isn't, proceed to step 28 to boost the booster line concurrently by the first and second capacitors $C_A$ and $C_B$; if it is, proceed to step 32 to boost the booster line solely by the first capacitor $C_A$. At step 28, when the first capacitor $C_A$ and the second capacitor $C_B$ boosting concurrently, the signals are in the condition of the first switching means $P_1$ turned on, the second switching means $P_2$ turned off, and control signals A and B staying high. Step 30 checks whether the bit-line sensing process in the memory device has finished, if it hasn't, back to step 28; if it has, proceed to step 32. Exception for the capacitor $C_A$, the capacitor $C_B$ is also precharged in step 32 where the first switching means $P_1$ is turned off, the second switching means $P_2$ is turned on, control signal A goes high and control signal B stays low. Finally, step 34 checks whether the circuit is inactivated from boosting, if it isn't, back to step 32; if it is, end this cycle at step 36 by concurrently precharging the first and second capacitors $C_A$ and $C_B$.

One advantage of this invention is the circuit provides variable boosting ratios by selectively activating the second capacitor $C_B$ depending on various operation states. Another advantage of this invention is that the second capacitor $C_B$ is allowed to be precharged independently from the precharging of the first capacitor $C_A$, thereby shortening the total precharging time of the circuit and improve the performance for the whole memory device. Moreover, because the second capacitor $C_B$ is not directly connected to the booster line, it would serve as the de-coupling capacitor for stabilizing the voltage level on the external power line.

As is understood by a person skilled in the art, the foregoing preferred embodiment of the present invention is merely for illustrative of the present invention rather than limiting the present invention. It is intended to cover various modifications and similar arrangements included within the spirit and scope of the appended claims, the scope of which should be accorded the broadest interpretation so as to encompass all such modifications and similar structure.

What is claimed is:

1. A circuit with variable voltage boosting ratios in a memory device for raising a voltage level on a booster line with a selected voltage boosting ratio in the memory device, the circuit comprising:

a first capacitor electrically connecting to the booster line for raising the voltage level on the booster line, wherein the first capacitor responds to a first control signal to boost the voltage level on the booster line or be precharged by a precharging line;

first switching means electrically connecting to the booster line; second switching means electrically connecting to a power line in the memory device;

a second capacitor, responding to a second control signal, and coupling to the booster line through the first switching means and the power line through the second switching means, respectively, said second capacitor responding to said second control signal to selectively boost the voltage level on the booster line together with the first capacitor when the first switching means is turned on and the second switching means is turned off, or being precharged by the power line when the first switching means is turned off and the second switching means is turned on; and a scheme for controlling the first capacitor and the second capacitor, wherein the scheme comprises:

activating the circuit for boosting the voltage level on the booster line;

boosting the voltage level solely by the first capacitor when the voltage level is greater than a predetermined check value; and boosting the voltage level by the first capacitor and the second capacitor concurrently when the voltage level is less than a predetermined check value.

2. The circuit of claim 1, when the first switching means is turned off and the second switching means is turned on, the second capacitor functioning as a de-coupling capacitor for stabilizing electric signals on the power line.

3. The circuit of claim 1, further comprising a number of inverters for delaying the first control signal to reach the first capacitor.

4. The circuit of claim 1, further comprising a number of inverters for delaying the second control signal to reach the second capacitor.

5. The circuit of claim 1, wherein the first switching means includes a PMOS transistor.

6. The circuit of claim 1, wherein the second switching means includes a PMOS transistor.

7. The circuit of claim 1, when boosting the voltage level by the first capacitor and the second capacitor concurrently, the first switching means being turned on, the second switching means being turned off, the first control signal staying at a high level, and the second control signal staying at a high level.

8. The circuit of claim 1, after boosting the voltage level by the first capacitor and the second capacitor, the scheme further comprising:

precharging the second capacitor solely when the memory device finishes a booster line sensing process; and precharging the first capacitor and the second capacitor concurrently, when the circuit is inactivated from boosting the voltage level on the booster line.

9. The circuit of claim 8, when precharging the second capacitor solely, the first switching means being turned off, the second switching means being turned on, the first control signal staying at a high level, and the second control signal staying at a low level.

10. A circuit with variable voltage boosting ratios in a memory device for raising a voltage level on a booster line with a selected voltage boosting ratio in the memory device, the circuit comprising:

a first capacitor electrically connecting to the booster line for raising the voltage level on the booster line, wherein the first capacitor responds to a first control signal to boost the voltage level on the booster line or be precharged by a precharging line;

first switching means electrically connecting to the booster line; second switching means electrically connecting to a power line in the memory device;

a second capacitor, responding to a second control signal, and coupling to the booster line through the first switching means and the power line through the second switching means, respectively, said second capacitor responding to said second control signal to selectively boost the voltage level on the booster line together with the first capacitor when the first switching means is turned on and the second switching means is turned off, or being precharged by the power line when the first switching means is turned off and the second switching means is turned on; and said circuit having a scheme for controlling the first capacitor and the second capacitor, wherein the scheme comprises:

activating the circuit for boosting the voltage level on the booster line;

boosting the voltage level solely by the first capacitor when the voltage level is greater than a predetermined check value; and boosting the voltage level by the first capacitor and the second capacitor concurrently when the voltage level is less than a predetermined check value.

11. The circuit of claim 10, when boosting the voltage level by the first capacitor and the second capacitor concurrently, the first switching means being turned on, the second switching means being turned off, the first control signal staying at a high level, and the second control signal staying at a high level.

12. The circuit of claim 10, after boosting the voltage level by the first capacitor and the second capacitor, the scheme further comprising:

precharging the second capacitor solely when the memory device finishes a booster line sensing process; and precharging the first capacitor and the second capacitor concurrently, when the circuit is inactivated from boosting the voltage level on the booster line.

13. The circuit of claim 2, when precharging the second capacitor solely, the first switching means being turned off, the second switching means being turned on, the first control signal staying at a high level, and the second control signal staying at a low level.

* * * * *